(12) United States Patent
Tredwell et al.

(10) Patent No.: US 9,060,419 B2
(45) Date of Patent: Jun. 16, 2015

(54) SUBSTRATE FORMED ON CARRIER HAVING RETAINING FEATURES AND RESULTANT ELECTRONIC DEVICE

(75) Inventors: Timothy J. Tredwell, Fairport, NY (US); Roger S. Kerr, Brockport, NY (US)

(73) Assignee: Carestream Health, Inc., Rochester, NY (US)

( * ) Notice: Subject to any disclaimer, the term of this patent is extended or adjusted under 35 U.S.C. 154(b) by 1242 days.

(21) Appl. No.: 12/394,518

(22) Filed: Feb. 27, 2009

(65) Prior Publication Data

US 2009/0211791 A1  Aug. 27, 2009

Related U.S. Application Data

(63) Continuation-in-part of application No. 12/028,194, filed on Feb. 8, 2008, which is a continuation-in-part of application No. 12/028,182, filed on Feb. 8, 2008, now abandoned, which is a continuation-in-part of application No. 12/028,174, filed on Feb. 8, 2008, now abandoned, which is a continuation-in-part of application No. 12/028,206, filed on Feb. 8, 2008, now Pat. No. 7,743,492.

(51) Int. Cl.
| | |
|---|---|
| *H05K 3/30* | (2006.01) |
| *H05K 3/00* | (2006.01) |
| *H05K 1/03* | (2006.01) |
| *H05K 1/05* | (2006.01) |

(52) U.S. Cl.
CPC ............. *H05K 3/007* (2013.01); *Y10T 29/4913* (2015.01); *H05K 3/303* (2013.01); *H05K 2201/10166* (2013.01); *H05K 1/0393* (2013.01); *H05K 1/05* (2013.01); *H05K 3/0052* (2013.01); *H05K 2201/10598* (2013.01); *H05K 2203/016* (2013.01); *H05K 2203/0228* (2013.01)

(58) Field of Classification Search
CPC ..... H05K 1/0393; H05K 1/05; H05K 3/0052; H05K 3/007; H05K 3/303; H05K 2201/10598; H05K 2201/10166; H05K 2203/016; 2203/0228; Y10T 29/4913
USPC ............ 29/829, 830, 832, 760; 361/749, 760, 361/765, 777; 174/254, 260, 261, 262
See application file for complete search history.

(56) References Cited

U.S. PATENT DOCUMENTS

2006/0207967 A1* 9/2006 Bocko et al. .................... 216/24
2007/0091062 A1   4/2007 French et al.

OTHER PUBLICATIONS

ASM Handbook, vol. 21: Composites, 2001, p. 434 and 839.*

(Continued)

*Primary Examiner* — Peter DungBa Vo
*Assistant Examiner* — Jeffrey T Carley

(57) ABSTRACT

A method for forming an electronic device on a flexible substrate conditions at least one surface of a carrier to form at least one retaining feature on the surface for retaining a flexible substrate. The flexible substrate is provided by deposition or lamination f one or more layers of substrate material onto the carrier. A portion of the substrate is processed to form the electronic device on the processed portion of the substrate. At least the processed portion of the substrate is released from the carrier to provide the flexible substrate having electronic device formed thereon. An electronic device is formed on a flexible substrate in accordance with the method.

22 Claims, 18 Drawing Sheets

(56) References Cited

OTHER PUBLICATIONS

U.S. Appl. No. 11/461,080, filed Jul. 31, 2006, entitled: Flexible Substrate With Electronic Devices Formed Thereon, by Roger Stanley Kerr et al.

U.S. Appl. No. 11/538,173, filed Oct. 3, 2006, entitled: Flexible Substrate With Electronic Devices and Traces, by Roger Stanley Kerr et al.

* cited by examiner

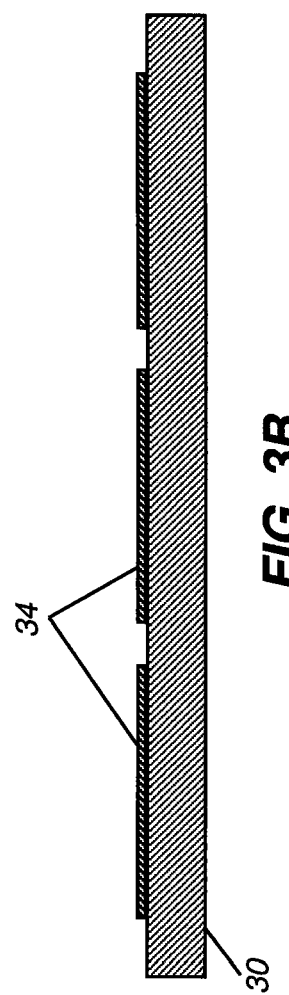

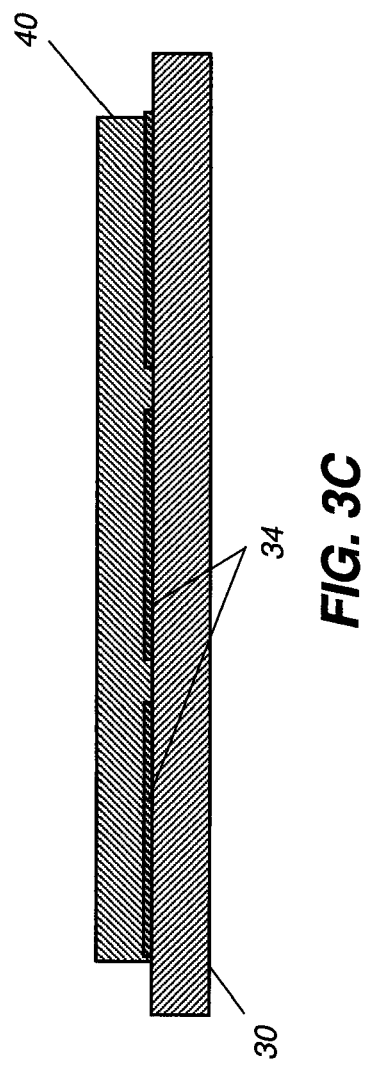

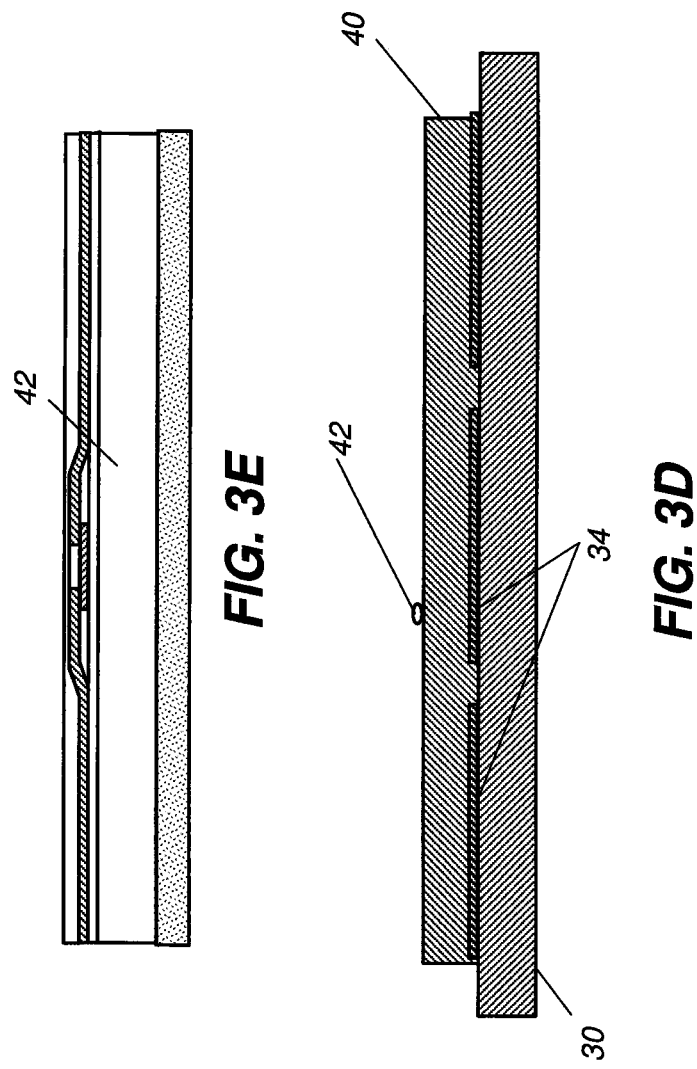

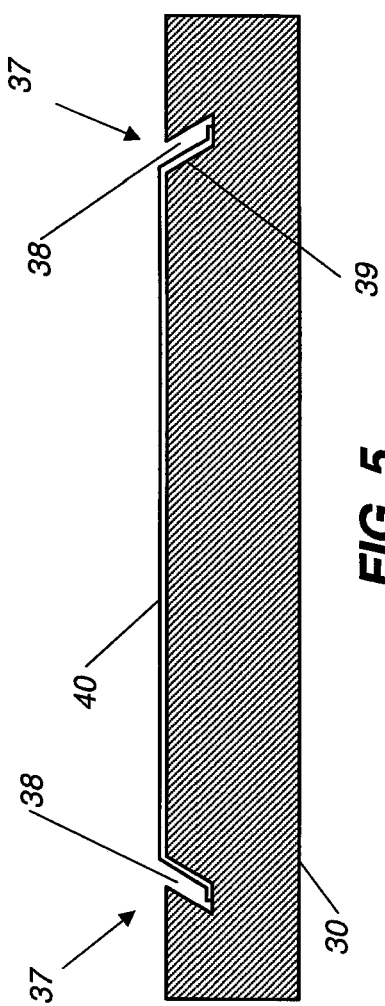

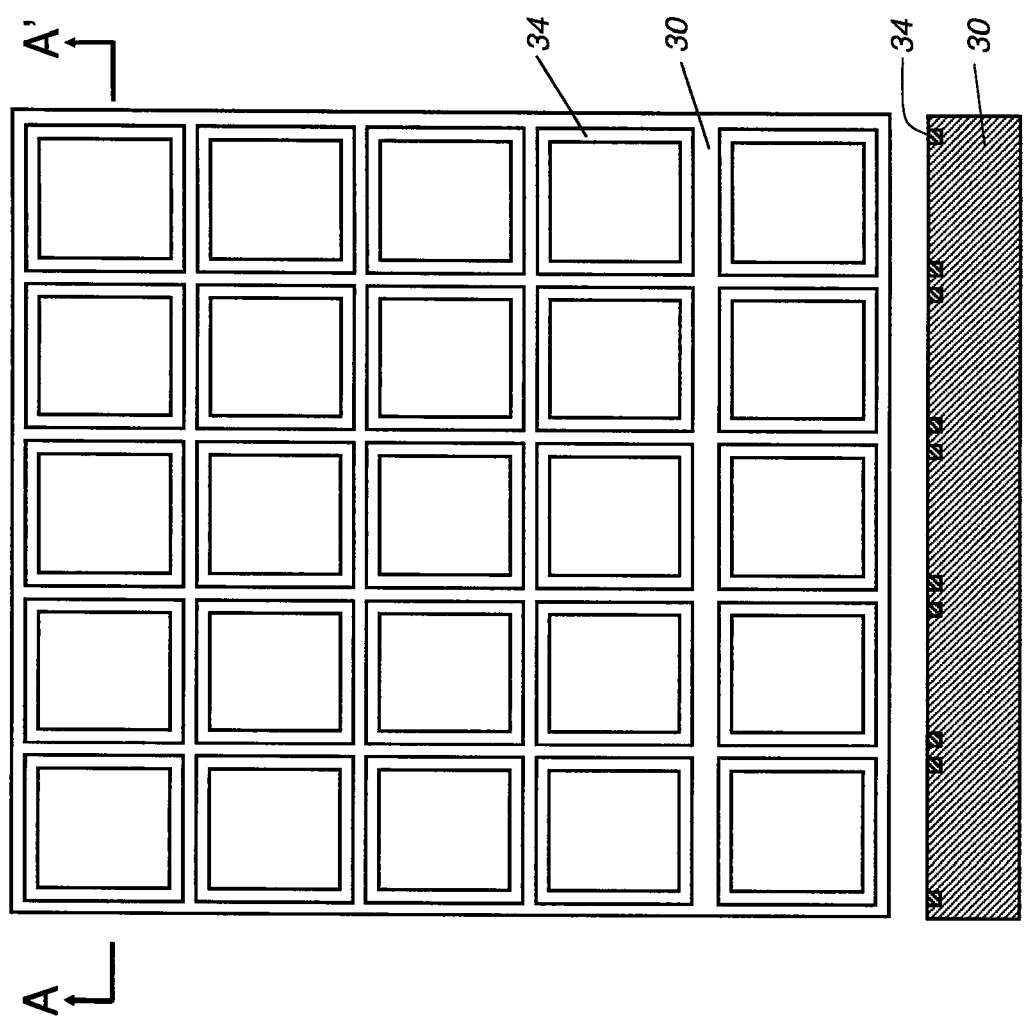

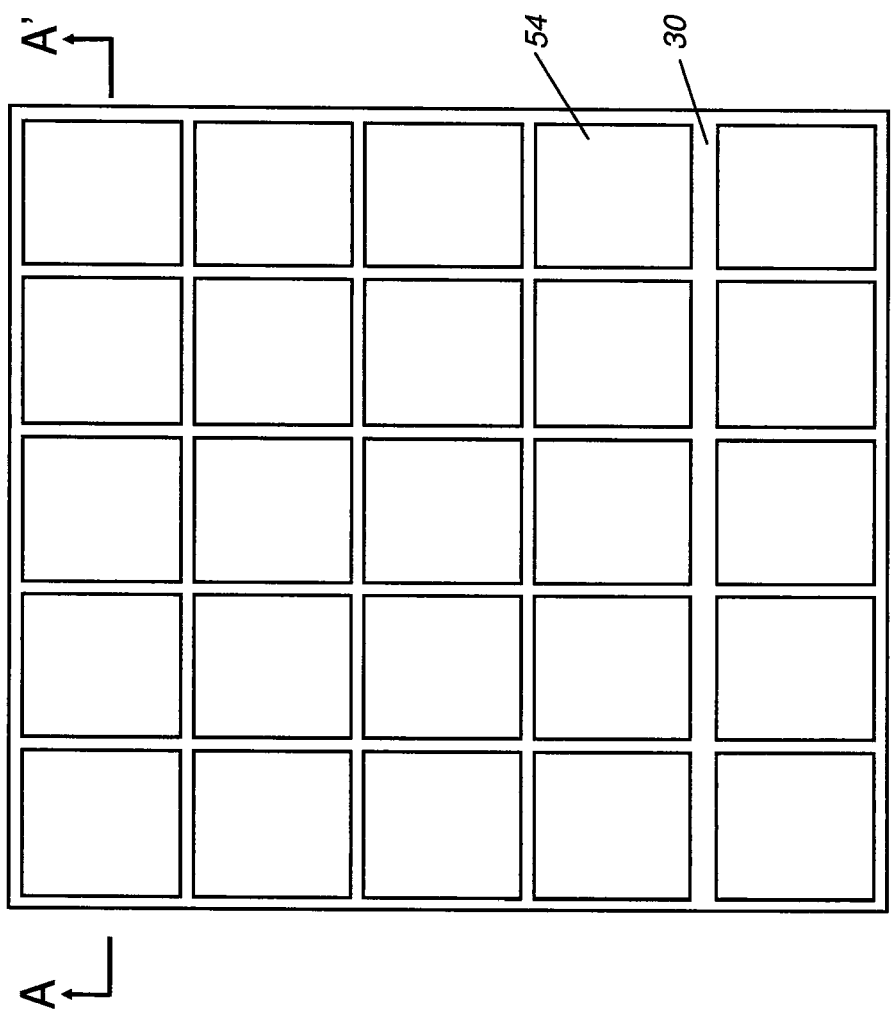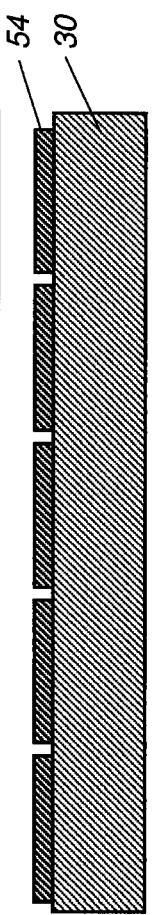
FIG. 7A
FIG. 7B

SUBSTRATE FORMED ON CARRIER HAVING RETAINING FEATURES AND RESULTANT ELECTRONIC DEVICE

CROSS REFERENCE TO RELATED APPLICATIONS

This application is a Continuation-in-Part of the following commonly assigned, copending applications:

(a) U.S. patent application Ser. No. 12/028,194 filed Feb. 8, 2008 by Kerr et al. entitled METHOD FOR FORMING AN ELECTRONIC DEVICE ON A FLEXIBLE SUBSTRATE SUPPORTED BY A DETACHABLE CARRIER;

(b) U.S. patent application Ser. No. 12/028,182 filed Feb. 8, 2008 by Kerr et al entitled METHOD OF FORMING AN ELECTRONIC DEVICE ON A SUBSTRATE SUPPORTED BY A CARRIER AND RESULTANT DEVICE;

(c) U.S. patent application Ser. No. 12/028,174 filed Feb. 8, 2008 by Kerr et al entitled METHOD FOR FORMING AN ELECTRONIC DEVICE ON A FLEXIBLE METALLIC SUBSTRATE AND RESULTANT DEVICE; and (d) U.S. patent application Ser. No. 12/028,206 filed Feb. 8, 2008 by Kerr et al entitled METHOD FOR FORMING CAST FLEXIBLE SUBSTRATE AND RESULTANT SUBSTRATE AND ELECTRONIC DEVICE.

The disclosure of each of these applications is incorporated by reference into the present application.

FIELD OF THE INVENTION

This invention generally relates to electronic device fabrication and more particularly relates to a method for forming a flexible substrate onto a supporting carrier and fabricating electronic devices thereon, and the resultant electronic device.

BACKGROUND OF THE INVENTION

Thin-film transistor (TFT) devices, widely used in switching or driver circuitry for electro-optical arrays and display panels, are conventionally fabricated on rigid substrates. Typically, these substrates are of glass or silicon. The TFT devices are formed onto the substrate using a well-known sequence of deposition, patterning and etching steps. For example, amorphous silicon TFT devices are formed in a process that uses deposition, patterning, and etching of metals, such as aluminum, chromium or molybdenum, of amorphous silicon semiconductors, and of insulators, such as $SiO_2$ or $Si_3N_4$, onto a substrate. The semiconductor thin film is formed in a series of patterned layers having typical thicknesses ranging from several nm to several hundred nm, with intermediary layers having thicknesses on the order of a few microns.

The requirement for a rigid substrate has been based largely on the demands of the fabrication process itself. Thermal characteristics are of particular importance, since TFT devices are fabricated at relatively high temperatures. Thus, the range of substrate materials that have been used successfully is somewhat limited, generally to glass, quartz, or other rigid, silicon-based materials.

There is considerable interest in forming TFT devices on flexible substrates, such as metal foil and plastic substrates. However, there are a number of practical problems that must be addressed for handling and processing flexible substrates. Fabrication equipment for thin-film components, designed for use with rigid substrate materials, requires that the receiving surface of the substrate be very flat and well-supported. To achieve the needed flatness and support, a flexible substrate must be mounted on a carrier of some type during fabrication. Rigid glass carriers have been used, for example. Following fabrication processing, the substrate can be removed from its carrier. Conventional solutions that have been used for mounting the carrier include the use of adhesives, adhesive tape, and various clamping schemes. U.S. Patent Application Publication 2007/0091062 discloses various electronic devices having plastic substrates coated onto the whole surface of rigid carriers during device fabrication, without patterning the surface into release and non-release areas. Although, in prototype modeling, these conventional solutions have shown the feasibility of forming thin-film circuitry on a flexible substrate, the present applicants have found that they fall short of what is needed for volume manufacture, require considerable handling of the flexible substrate, and impose some constraints on minimum substrate thickness.

Various other techniques for supporting a flexible substrate on a carrier have been developed. For example, reference is made to U.S. Patent Application 2008/0026581 (Ser. No. 11/461,080) filed Jul. 31, 2006 by Tredwell et al. entitled FLEXIBLE SUBSTRATE WITH ELECTRONIC DEVICES FORMED THEREON; and U.S. Patent Application 2008/0090338(Ser. No. 11/538,173) filed Oct. 3, 2006 by Tredwell et al. entitled FLEXIBLE SUBSTRATE WITH ELECTRONIC DEVICES AND TRACES, incorporated herein by reference.

The fabrication process for the TFT may require temperatures in the range of 125-300 degrees C. or higher. One particular problem with metal substrates relates to expansion and contraction of materials under temperature extremes, normally expressed in terms of Coefficient of Thermal Expansion (CTE). Metallic materials differ significantly in CTE from glass, for example. The significant difference in CTE between metals and glass results in excessive stress that can shatter a glass carrier or can cause a metal substrate to release from a glass carrier prematurely, losing its dimensional stability.

Although there has been great interest in developing flexible metallic substrates, the incompatibility of metal foils with a conventional glass carrier over a broad temperature range imposes some constraints on substrate material type. There is a recognized need for methods that allow a non-metallic carrier to support a flexible metal substrate during electronic component fabrication.

SUMMARY OF THE INVENTION

An object of the present invention is to address the need for supporting a flexible substrate on a carrier for electronic device fabrication. With this object in mind, the invention provides a method for forming an electronic device on a flexible substrate comprising steps of: conditioning at least one surface of a carrier to form at least one retaining feature on that surface for retaining a flexible substrate; forming the flexible substrate by deposition or lamination of one or more layers of substrate material onto the carrier and the at least one retaining feature; processing a portion of the deposited substrate to form the electronic device on that portion of the substrate; and releasing at least the processed portion of the substrate from the carrier to provide the electronic device on the flexible substrate. An array of such retaining features may be formed pattern-wise onto the surface of the carrier. The invention also provides an electronic device made in accordance with the described method.

A feature of the present invention is that it provides an electronic device fabricated onto a flexible substrate. The range of flexible substrates available using embodiments of the present invention can include various types of metal or plastic, including some types of metal foil, and other very thin substrates.

An advantage of the present invention is that it adapts a glass or other type of carrier for processing a flexible substrate over a wide temperature range.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

FIG. 3B is a cross-sectional view (B-B) of the conditioned carrier of FIG. 3A.

FIG. 3C is a cross-sectional view (B-B) of the conditioned carrier of FIG. 3A with a flexible substrate deposited thereon.

FIGS. 3D and 3E respectively show a cross-sectional view (B-B) of the carrier of FIG. 3A having an electronic device formed onto the flexible substrate and a fragmentary enlarged view of the electronic device.

FIG. 5 is a cross sectional view showing a carrier with an alternate arrangement of retaining features.

FIG. 6A is a plan view of a carrier on which an array of retaining features has been formed.

FIGS. 6B to 6G show sectional views (A-A') of FIG. 6A, illustrating a sequence of steps of an embodiment of the method of the invention.

FIG. 7A is a plan view of a carrier on which an array of release layers has been formed.

FIGS. 7B to 7G show sectional views (A-A') of FIG. 7A, illustrating a sequence of steps of another embodiment of the method of the invention.

DETAILED DESCRIPTION OF THE INVENTION

Reference is made to commonly assigned, copending U.S. patent application Ser. No. 12/394,575 filed DATE, 2009 by Tredwell et al, entitled METHOD FOR CONDITIONING A SUBSTRATE SURFACE FOR FORMING AN ELECTRONIC DEVICE THEREON AND RESULTANT DEVICE, incorporated herein by reference.

It is to be understood that elements not specifically shown or described in the following detailed description may take various forms well known to those skilled in the art. Figures given in this application are representative of overall spatial relationships and arrangement of layers for deposition onto a substrate and may not be drawn to scale.

As the term is used in the present description, "plastic" refers to a material having high polymer content, usually made from polymeric synthetic resins, which may be combined with other ingredients, such as curing agents, fillers, reinforcing agents, colorants, and plasticizers. A "resin" is a synthetic or naturally occurring polymer. Plastic is solid in its finished state, and, at some stage during its manufacture or processing into finished articles, can be shaped by flow. Plastics are typically formed using a curing process in which a solvent is evaporated at a suitable rate. Plastic includes thermoplastic materials and thermosetting materials. In the context of the present disclosure, the term "flexible" refers generally to substrate sheet materials that are thinner than about 1.5 mm.

Figure 1:
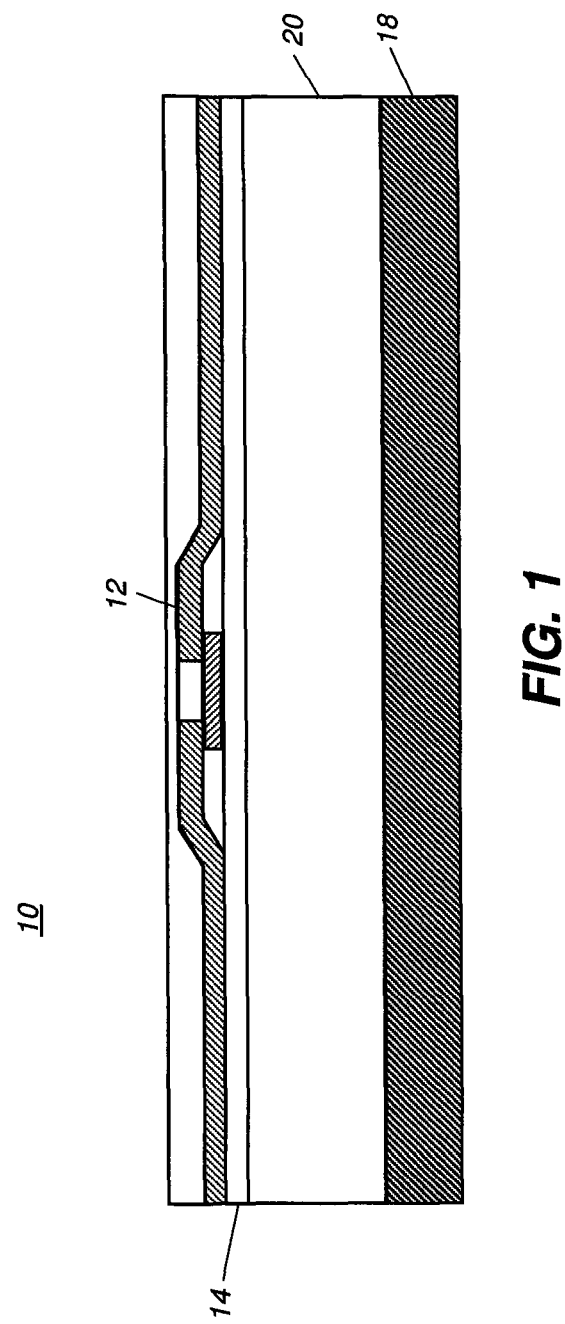
FIG. 1 is a side view of an electronic device formed on a flexible substrate supported on a carrier.

Referring to FIG. 1, there is shown an electronic device 10 formed according to the present invention. A thin-film component 12, such as a conductor, a thin-film transistor, a diode, or other component, is formed onto a flexible substrate 20 such as a metal foil or plastic film. During device fabrication, substrate 20 is provided on a carrier 18 that provides dimensional stability for substrate 20 over the range of processing temperatures and conditions required for thin-film device manufacture. If necessary, a planarization or isolation layer 14 can be applied to the substrate before components are formed.

The methods of the present invention provide ways to fabricate electronic device 10 on a flexible substrate using a carrier, as described with reference to the example of FIG. 1. Using the apparatus and methods of the present invention, a range of flexible substrates can be used, supported on the carrier without requiring a match between the CTE of the substrate and that of the carrier. Thus, for example, a metal such as stainless steel having a CTE of about 17 ppm/degree C. could be supported on a glass carrier having a CTE in the range of 2-3 ppm/degree C. Unlike substrate mounting methods requiring closely matched CTE values, the present invention allows respective CTE values of the carrier and the flexible substrate to differ from each other by more than 2 ppm/degree C.

Figure 2D:
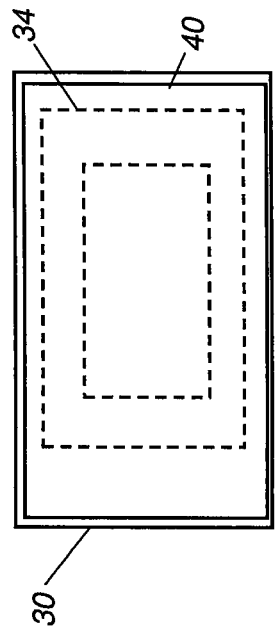
FIGS. 2D to 2F respectively show plan, perspective, and cross-sectional (F-F) views of a substrate material deposited onto the conditioned carrier of FIGS. 2A to 2C.
Figure 2E:
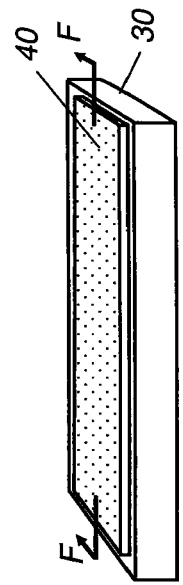
Figure 2F:
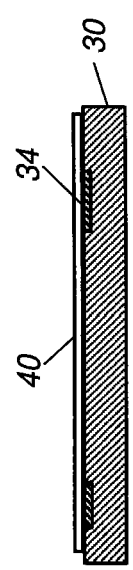
Figure 2A:
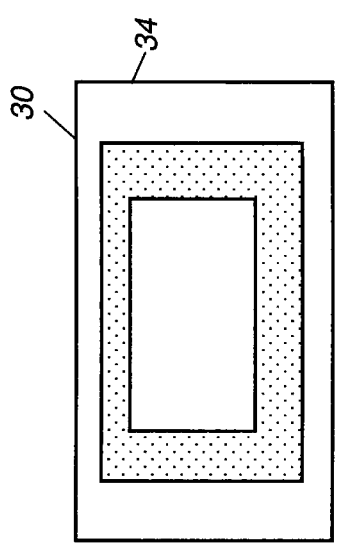
FIGS. 2A to 2C respectively show plan, perspective, and cross-sectional (C-C) views of a carrier conditioned with retaining features for supporting a flexible substrate according to one embodiment.
Figure 2B:
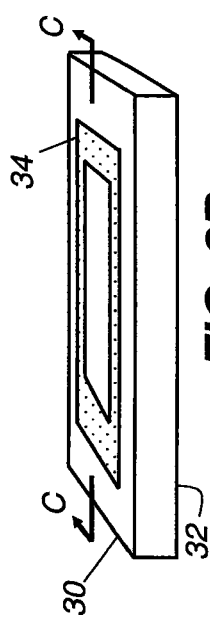
Figure 2C:
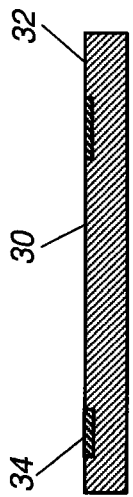
Figure 2K:
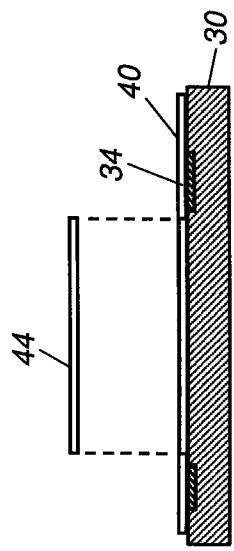
FIGS. 2J and 2K respectively show perspective and cross-sectional (K-K) views of a portion of a substrate having fabricated electronic components and being removed from its carrier.

The method of the invention illustrated in FIGS. 2A through 2I comprises basic steps of the method in one exemplary embodiment. FIGS. 2A to 2C show three views: plan, perspective, and cross-sectional (C-C) views, respectively, of a carrier 30 that has been conditioned for supporting a substrate according to one embodiment. One or more retaining features 34 are formed on a surface 32 of carrier 30. In this embodiment, retaining feature 34 is a portion of the carrier 30 surface that has been treated in a manner to be described to improve its adhesion to substrate material that is deposited thereon or laminated thereto. In an embodiment in which carrier 30 is a glass plate, for example, an abrasive process such as sandblasting or chemical etching is used to form retaining features 34. In the particular example of FIG. 2A, retaining feature 34 is an abrasively treated, open-centered frame or band that extends near the outer periphery of surface 32. Other patterns and arrangements are possible, as described subsequently.

The plan, perspective, and cross-sectional (F-F) views of FIGS. 2D to 2F show a flexible substrate 40 formed or laminated onto carrier 30. Substrate 40 is deposited or laminated directly onto carrier 30 as one or more layers of material. Among the many possible deposition processes are evaporation, electroforming, or plasma deposition, as well as various types of coatings application processes, for example spin coating or spray coating. Lamination processes may be used. Improved adhesion of substrate 40 to carrier 30 is achieved in the area of retaining features 34.

Figure 2J:
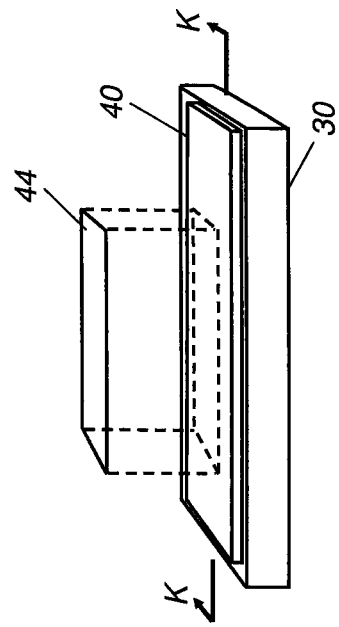
Figure 2I:
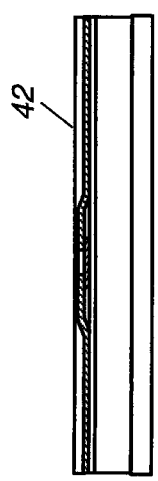
FIGS. 2G to 2I respectively show perspective, cross-sectional (H-H) and fragmentary enlarged views of electronic device fabrication onto a flexible substrate that has been deposited on the carrier.
Figure 2H:
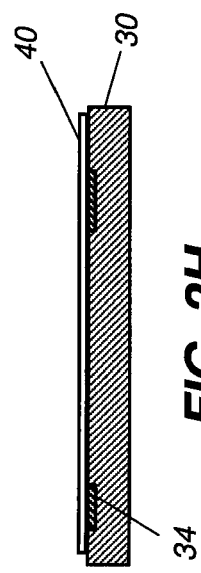
Figure 2G:
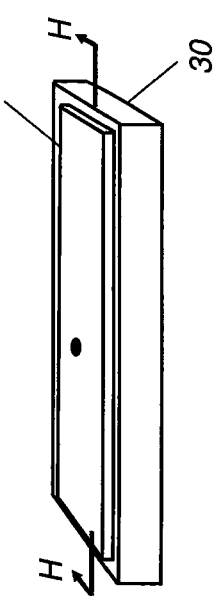

FIGS. 2G to 2I show perspective and cross-sectional (H-H) views of the next step in this embodiment of the method, which is fabrication of one or more electronic devices 42, shown enlarged fragmentarily in FIG. 2I. In the particular example of FIG. 2I, electronic device 42 is represented by a single TFT transistor, as was shown in FIG. 1. During device fabrication processing, substrate 40 is securely held onto carrier 30 due to its engagement with retaining features 34.

FIGS. 2J and K show how a flexible substrate 44 supporting one or more electronic devices 42 can be released from carrier 30 following device fabrication. In this exemplary embodiment, the section of flexible substrate 44 with electronic devices 42 is cut away from the surface of conditioned carrier 30. In this particular example, the section of substrate 44 with electronic devices 42 lies within the boundary of retaining feature 34, which facilitates removal. The balance of substrate 40 outside section 44 that remains on carrier 30 is not needed and can be removed and discarded.

Figure 3A:
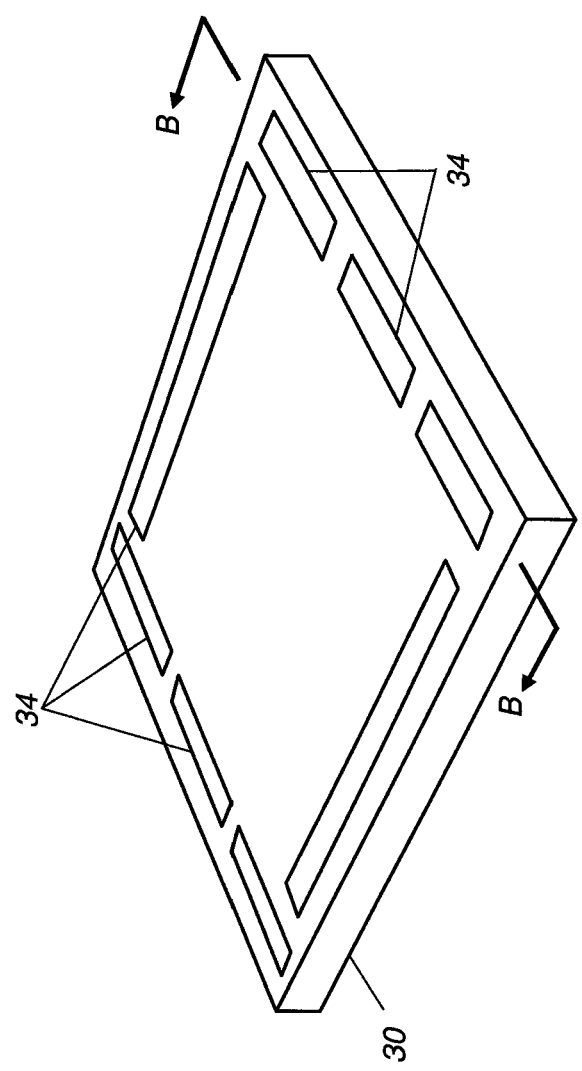
FIG. 3A is a perspective view of a carrier having a surface conditioned with a pattern of retaining features for mounting a deposited flexible substrate according to another embodiment.

Retaining features 34 could be arranged pattern-wise in various ways along the surface of carrier 30 and could be formed by treating the carrier 30 surface in any of a number of ways. As noted previously, roughening the surface is one method used to form a pattern of one or more retaining features 34. Another technique that can be used is deposition of a pattern of a seed material onto the carrier 30 surface. Referring to the perspective view of FIG. 3A, there is shown a pattern of one or more retaining features 34 formed by deposition of a seed material. In one embodiment for obtaining a flexible metal substrate, a different metal than will be used for flexible substrate 40 is deposited in a pattern, such as that shown in FIG. 3A. As illustrated, the pattern may be made up of a plurality of elongate segments surrounding an open central area, rather than an open-centered continuous frame as in FIG. 2A. The cross-section view (B-B) of FIG. 3B shows retaining features 34 formed by material deposition. As shown in FIG. 3C, substrate 40 is then applied, for example by deposition or lamination, to the conditioned surface of carrier 30. FIGS. 3D and 3E show an electronic device 42 formed onto substrate 40. Then, to release the completed flexible substrate 44 with electronic device 42, a cutting process or other suitable process can be used.

Figure 4A:
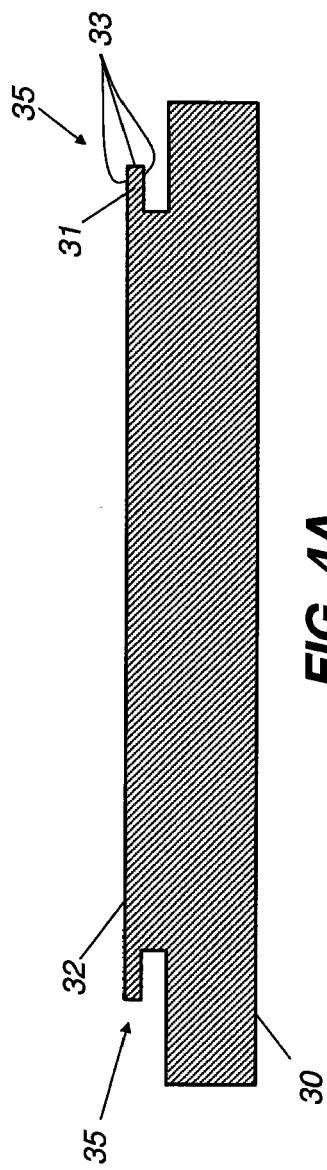
FIG. 4A is a cross-sectional view of a lipped carrier in a third embodiment.
Figure 4B:
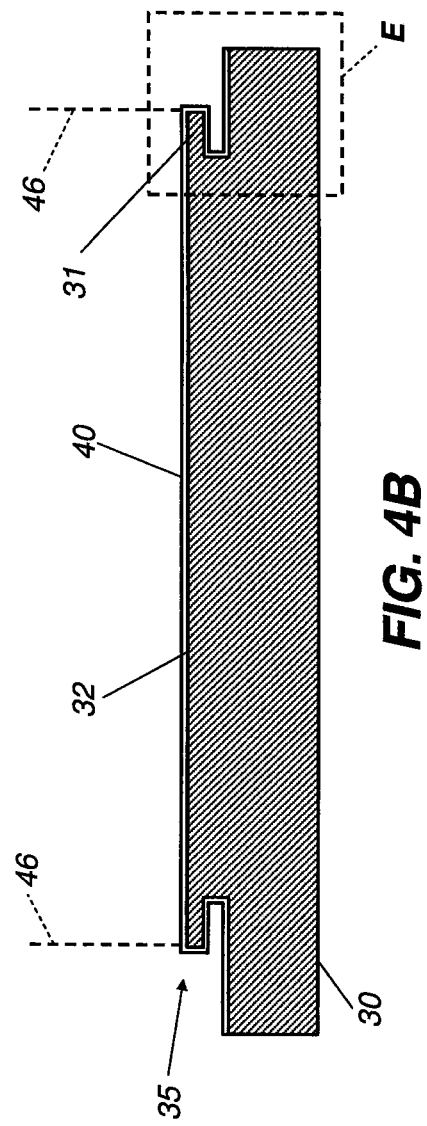
FIG. 4B is a cross-sectional view of the lipped carrier of FIG. 4A having a flexible substrate deposited thereon.
Figure 4C:
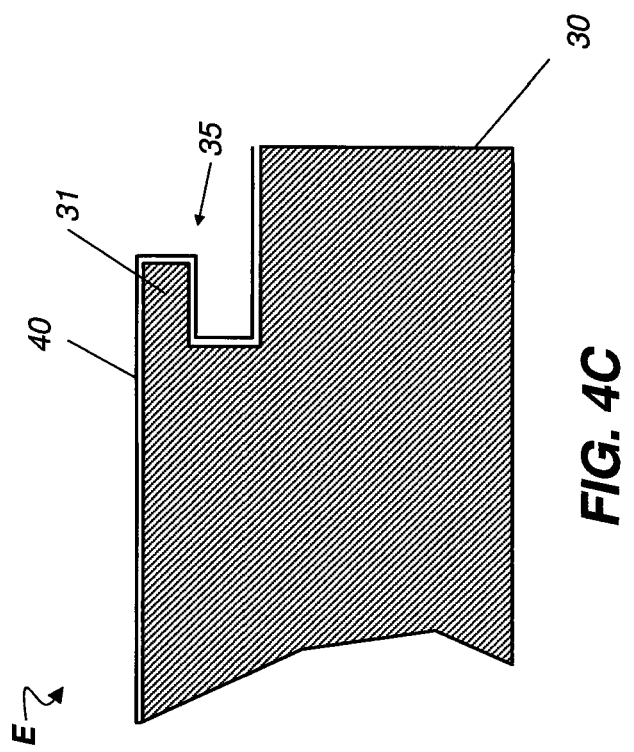
FIG. 4C is an enlarged cross-sectional view showing a retaining feature in a lipped carrier embodiment.
Figure 4D:
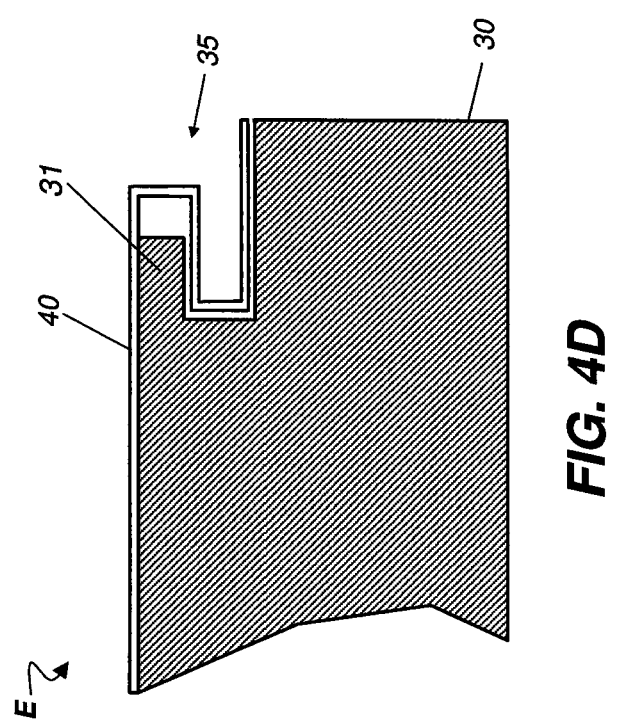
FIG. 4D is an enlarged cross-sectional view showing the substrate released from a lipped carrier to allow coefficient of thermal expansion mismatch or to release the substrate form the carrier.

The exemplary embodiments of FIGS. 2A-3E show retaining features 34 formed on the same planar surface 32 that supports the area of substrate 40 on which electronic device 42 is fabricated. The cross-sectional views of FIGS. 4A and 4B show a third embodiment in which alternative retaining features 35 are formed on an edge surface or other surface 32 of carrier 30. Referring first to FIG. 4A, a lipped glass plate is used as carrier 30. A peripherally extending lip 31 is formed into carrier 30 and comprises one or more surfaces 33. Lip 31 may be formed by grinding or by some combination of molding and abrasive treatment. This embodiment is one example in which the portion of surface 32 that provides retaining features 35 is alongside or behind the major working portion of the carrier surface 32 that will support a flexible carrier 40 during electronic device fabrication. The view of FIG. 4B shows a substrate 40 deposited or laminated onto carrier 30 formed in this manner. With this embodiment, the lipped portion is treated, shaped, or otherwise conditioned to provide retaining feature 35 along its edges to engage substrate 40. FIGS. 4C and 4D show enlarged views of lip 31 at one edge of substrate 40, showing how substrate 40 can be supported on carrier 30, thus allowing for differences in expansion/contraction with heat or cooling.

Flexible substrate 44 with electronic device 42, not shown in FIG. 4B, can be released from carrier 30 by cutting, as was described earlier with reference to FIGS. 2J and 2K. Alternately, when using the embodiment of FIGS. 4A and 4B, heat can be applied to release substrate 40 from carrier 30. FIG. 4B shows an area E with a cut line 46 that is enlarged in the partial views of FIGS. 4C and 4D. FIG. 4C shows a first condition, in which substrate 40 is securely held by carrier 30, such as following material deposition and fabrication steps. FIG. 4D then shows how heat expansion can be used to effect release of substrate 40 from lip 31 of carrier 30. This method takes advantage of the difference in CTE between conventional glass carrier 30 and substrate 40, particularly where metal is used. Heat differential could also be used for separating substrate 44 from the carrier 30 surface with embodiments such as those shown in FIGS. 4A through 4D. Substrate 44 may be removed by cutting along cut lines 46, for example.

The cross-sectional view of FIG. 5 shows a second alternative retaining feature 37 in which two or more peripherally extending grooves 38 are formed into surface 39 of carrier 30. Surface 39 provides the conditioned surface for adhesion of substrate 40 as it is deposited or laminated in this embodiment.

Example 1

In one embodiment, substrate 40 is a film to be formed from metal or plastic. Carrier 30 is a glass plate. The following basic sequence, in parallel with the basic flow shown in FIGS. 2A through 2K, is used.

1. Conditioning of the carrier surface. In this step, retaining features 34 are formed onto surface 32 of carrier 30 by photolithography and subsequent etching, forming a microstructure over an area that enhances adhesion properties.

2. Deposition of material for substrate 40. One or more layers of substrate material are deposited onto the conditioned carrier surface using sputtering or an evaporative technique. This enables substrate 40 to be formed to a uniform thickness. Lamination also may be used for various substrate materials.

3. Electronic device fabrication. Substrate 40, now formed on its carrier 30, is then processed in order to form one or more electronic devices 42, such as the TFT transistor 12 described with reference to FIG. 1.

4. Release of flexible substrate 44 with electronic device 41. The flexible substrate is then sliced away from carrier 30. Substrate material that was deposited onto retaining features 34 is stripped away in a clean-up step, using heat or solvents, so that carrier 30 can be reused.

The steps given for this example admit any of a number of variations. For example, the thickness as well as the composition of substrate 40 can be suitably adjusted. The microstructure used in forming retaining features 34 can use any of a number of types of different patterns.

Example 2

In another example embodiment, substrate 40 is formed from nickel. The sequence that follows uses the basic flow shown in FIGS. 3A through 3E.

1. Conditioning of the carrier surface. In this step, retaining features 34 are formed onto surface 32 of carrier 30 by deposition of chrome. Chrome is advantaged for its suitability for bonding to other materials. Retaining features 34 are formed using Atomic Layer Deposition (ALD), but could alternately be formed using any of a number of deposition methods, such as sputtering, for example. In one embodiment, retaining features 34 of chrome are about 400 Angstroms thick.

2. Deposition of material for substrate 40. One or more layers of nickel are deposited onto the conditioned carrier surface using a plating process, such as electroplating. Other plating or deposition methods could alternately be used such as, for example, plasma-based plating deposition, which operates using clouds of electron particles and ions. Still other available plating methods include thermal spray coating, vapor deposition and other evaporative techniques, ion plating, and Chemical Vapor Deposition (CVD), for example. The thickness of the deposited metal layer for substrate 40 is determined by the application.

3. Electronic device fabrication. Substrate 40, now formed on its carrier 30, is then processed in order to form one or more electronic devices 42, such as the TFT transistor 12 described with reference to FIG. 1.

4. Release of flexible substrate 44 with electronic device 42. The flexible substrate is then sliced away or otherwise removed from carrier 30. Substrate material that was deposited onto retaining features 34 is stripped away in a clean-up step, using heat or solvents, so that carrier 30 can be reused.

Example 3

In another example embodiment, a rectangular array of multiple retaining features 34 is formed on the surface of carrier 30. The following basic sequence, in parallel with the basic flow shown in FIGS. 6A through 6G, is used.

1. Conditioning of the carrier surface. As shown in FIGS. 6A and 6B, multiple retaining features 34 are formed onto surface 32 of carrier 30 by photolithography and subsequent etching, forming a microstructure over an area that enhances adhesion properties. Retaining features 34 may be patterned, for example, as in FIG. 2A or 3A.

Figure 6C:
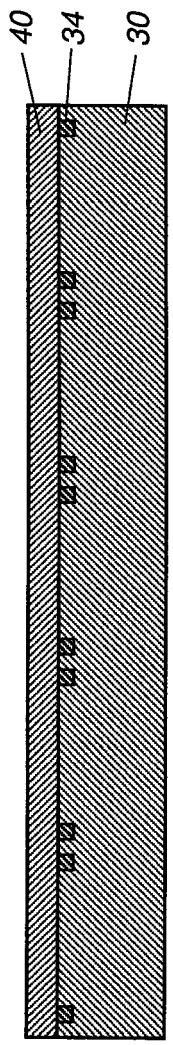

2. Deposition of material for substrate 40. As shown in FIG. 6C, one or more layers of substrate material are deposited onto the conditioned carrier surface using a sputtering or evaporation technique. This enables substrate 40 to be formed to a uniform thickness. Lamination also may be used for various substrate materials.

3. Electronic device fabrication. As shown in FIG. 6C, substrate 40, now formed on its carrier 30, is then processed in order to form multiple electronic devices 42, such as the TFT transistor 12 described with reference to FIG. 1. Each electronic device is located within its corresponding retaining ring 34 on the carrier 30.

Figure 6D:
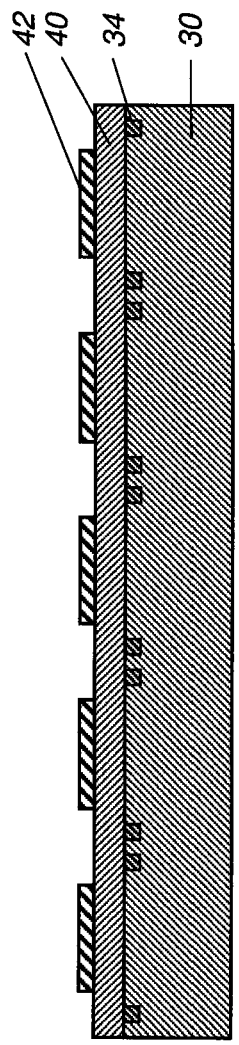
Figure 6E:
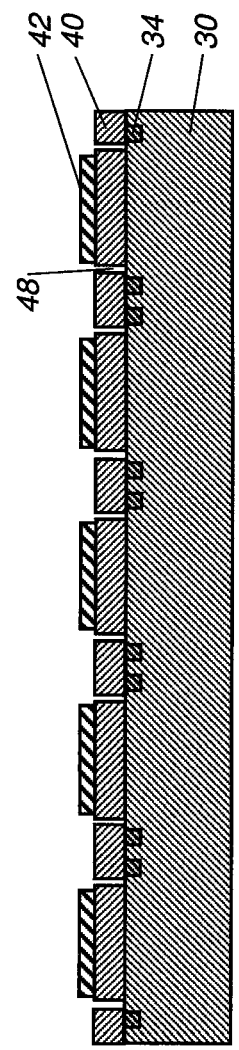
Figure 6F:
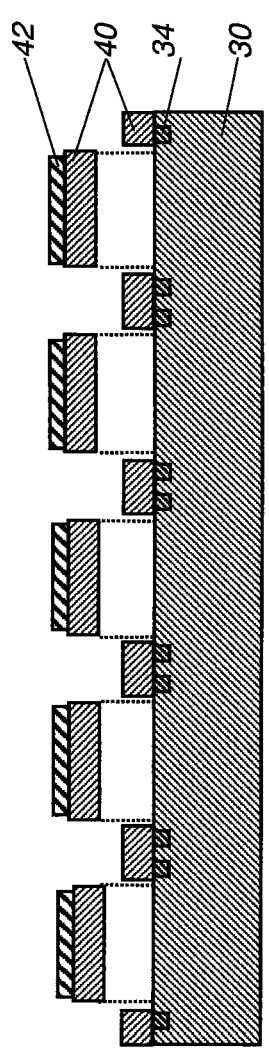

4. Release of the flexible substrate 44 with electronic device 42. As shown in FIGS. 6D to 6F, the flexible substrate is then sliced away from carrier 30 at multiple locations 48 surrounding each electronic device 42. Each individual electronic device 42 fabricated on the flexible substrate material 40 is thereby released from the carrier 30.

Figure 6G:
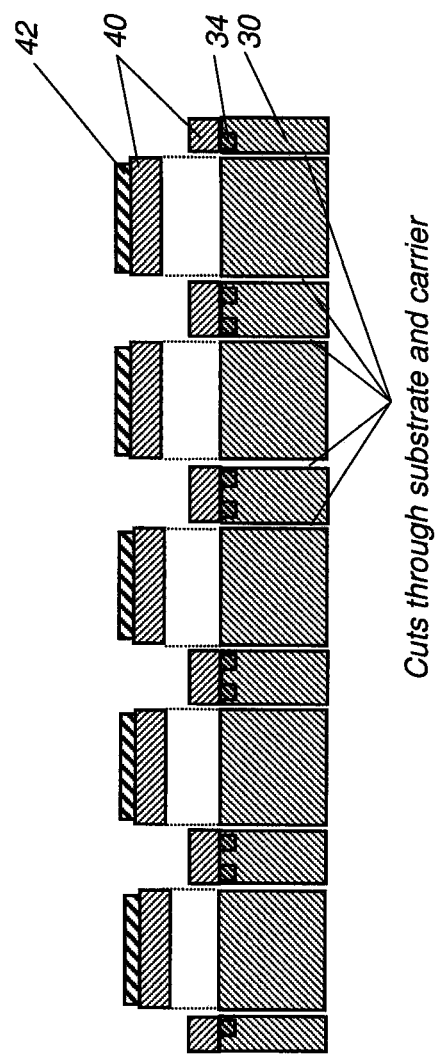

5. Alternatively, the cut to remove the flexible substrate from the carrier may also cut into or through the carrier, as shown in FIG. 6G. The substrate remains attached to the carrier in the retaining areas but separates from the carrier in the areas of the carrier without retaining areas. Cutting may be performed, for example, by saw-cutting, by scribe-and-break, or by laser cutting.

The steps given for this example admit any of a number of variations. For example, the microstructures forming retaining features 34 can use any of a number of different patterns.

Example 4

In another example embodiment, an array of rectangular release layers or features 54 is formed pattern-wise on the surface of carrier 30. The pattern of the release features corresponds to individual electronic devices that will be formed on release layer 54. The surfaces between the release features may be conditioned to form retaining features 34, not illustrated in FIGS. 7A to 7F. The following basic sequence, in parallel with the basic flow shown in FIGS. 7A through 7F, is used.

1. Conditioning of the carrier surface. A release layer 54 is coated over substrate 30. Examples of release layers include ProLIFT 2000™, manufactured by Brewer Science Inc. and Omnicoat™, manufactured by Micro-Chem Inc. of Newton, Mass.

2. Patterning of the release layer. As shown in FIGS. 7A and 7B, release layer 54 is patterned to form an array of rectangular release features by removing the release material in regions surrounding the planned location of individual electronic devices. Retaining features may be formed between the release features.

Figure 7C:
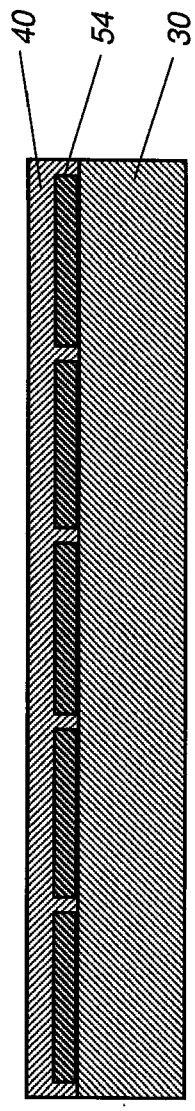

3. Deposition of material of substrate 40. As shown in FIG. 7C, one or more layers of substrate material 40 are deposited onto the conditioned carrier surface using a sputtering or evaporation technique. This enables substrate 40 to be formed to a uniform thickness. Lamination also may be used for various substrate materials.

Figure 7D:
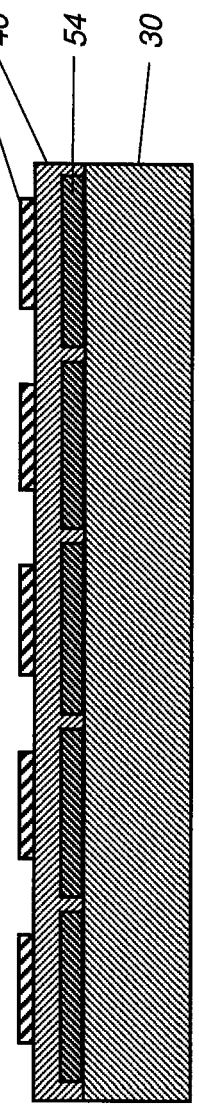

4. Electronic device fabrication. As shown in FIG. 7D, substrate 40, now formed on its carrier 30, is then processed in order to form multiple electronic devices 42, such as the TFT transistor described with reference to FIG. 1. Each electronic device 42 is located within the regions of release material 54 patterned on the carrier 30.

Figure 7E:
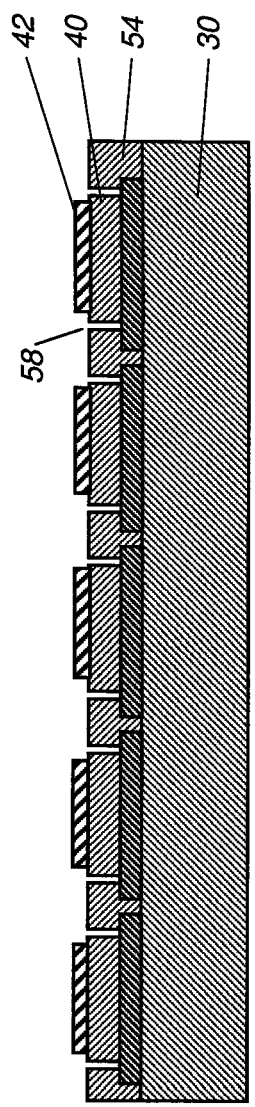
Figure 7F:
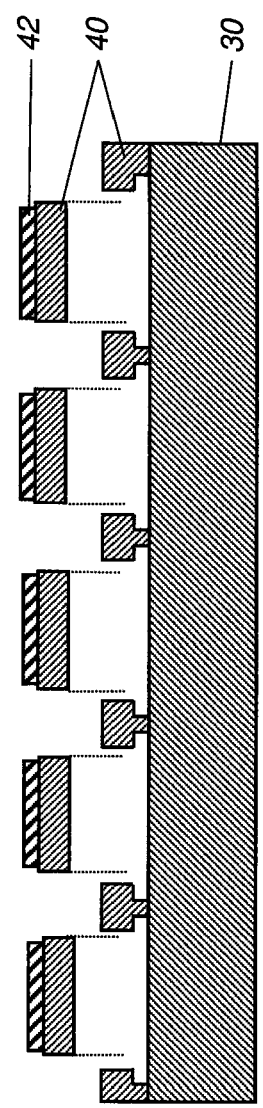

5. Release of the flexible substrate 44 with electronic device 42. As shown in FIGS. 7E and 7F, the flexible substrate 40 is then sliced away from carrier 30 at multiple locations 58 surrounding each electronic device 42. The release layer is removed by dissolution in a solvent or by etching. Each individual electronic device 42 fabricated on the flexible substrate material 40 is thereby released from the carrier 30. The release layer is dissolved chemically. For example, with Pro-LIFT 2000, a developer such as TMAH (Tetra-methyl-ammonium-hydroxide) may be used to dissolve the ProLIFT release layer.

Figure 7G:
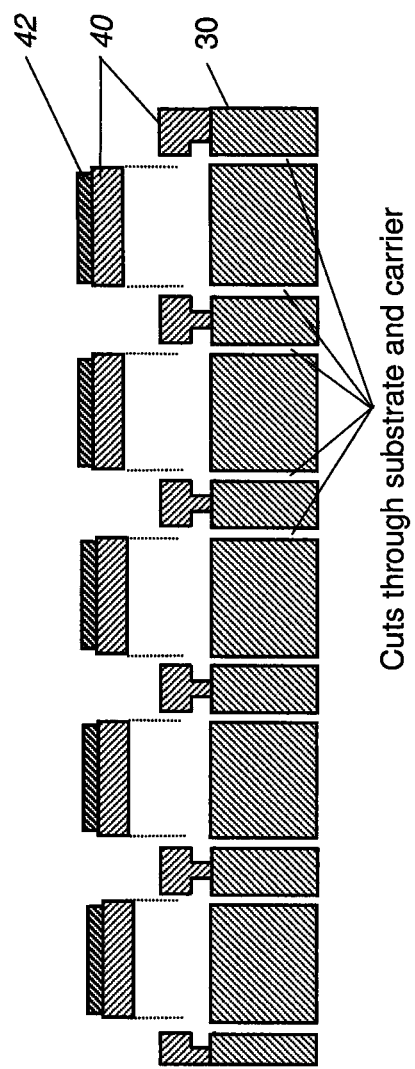

6. Alternatively, the cut to remove the flexible substrate from the carrier may also cut into or through the carrier, as shown in FIG. 7G. The substrate remains attached to the carrier in the areas of the carrier not containing a release layer but separates from the carrier in the areas of the carrier with a release layer. Cutting may be performed, for example, by saw-cutting, by scribe-and-break, or by laser cutting.

The processes described in Example 4 may be combined with the processes described in Example 1 or Example 2. For example, retaining areas may be formed on the carrier 30 and release layers 54 patterned inside the individual retaining areas, promoting adhesion in the retaining areas and reducing adhesion in the areas of the substrate 40 to be released from the carrier 30.

In an alternate embodiment, conditioning of the carrier may require separate treatment of areas that lie outside retaining features 34. Polishing or other surface conditioning techniques could be used for treating areas of the carrier 30 surface that lie outside of areas of retaining features 34.

In yet another alternate embodiment, carrier 30 is coated so that it is partially or wholly encased within one or more layers of substrate 40. In such an embodiment, one or more surfaces 32 are conditioned to provide retaining features that support substrate 40 during processing.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, although the present description and examples focus on metal substrates, methods of the present invention could similarly be applied using plastic or other substrate materials that can be deposited to form a flexible substrate. Thus, what is provided is a method for mounting a substrate to a carrier for forming an electronic device on a flexible substrate.

PARTS LIST 10 electronic device
12 thin-film component
14 layer
18 carrier
20 flexible substrate
30 carrier
31 lip
32 surface of carrier 30
33 surfaces of lip 31
34 retaining feature
35 first alternative retaining feature
37 second alternative retaining feature
38 grooves
39 surface of groove 38
40 flexible substrate
42 electronic device
44 flexible substrate with electronic device
46 cut line
48 multiple locations
54 release layer
58 cut location around device 42
E detail area

The invention claimed is:

1. A method for forming electronic devices on a flexible substrate, the method comprising:
conditioning a surface of a carrier to form at least one retaining feature on said surface of the carrier for adhering a flexible substrate on said surface of the carrier, the retaining feature formed in a shape of a continuous or segmented band surrounding a central region within the retaining feature;
forming the flexible substrate by deposition of one or more layers of flexible substrate material onto the surface of the carrier, the central region within the retaining feature, and onto the at least one retaining feature;
processing a portion of the deposited flexible substrate to form the electronic device over the central region within the retaining feature; and
releasing from the carrier the portion of the flexible substrate over the central region within the retaining feature to provide the flexible substrate having an electronic device formed thereon.

2. The method of claim 1 wherein the carrier is glass.

3. The method of claim 1 wherein the flexible substrate is metal.

4. The method of claim 1, wherein the step of conditioning the surface of the carrier comprises forming a continuous or segmented substantially rectangular retaining feature.

5. The method of claim 1 wherein forming the flexible substrate comprises one or more of the following deposition processes: electroforming, evaporation, and plasma deposition.

6. The method of claim 1, wherein the step of releasing comprises cutting through the portion of the flexible substrate over the central region within the retaining feature and around the electronic device.

7. The method of claim 1, wherein the respective coefficient of thermal expansion values of the carrier and the flexible substrate differ from each other by more than 2 ppm/degree C, and wherein the step of releasing comprises cooling the substrate, cooling the carrier, or both, responsive to the respective coefficient of thermal expansion values.

8. The method of claim 1, further comprising reusing the carrier by repeating the steps of conditioning, forming, processing and releasing.

9. The method of claim 1, further comprising:
forming a plurality of the retaining features, where the retaining features are arranged as a matrix of rows and columns on said surface of the carrier for retaining the flexible substrate thereon, and where each of the retaining features encloses a corresponding unit area on said surface of the carrier.

10. The method of claim 9, wherein the step of conditioning comprises treating said surface of the carrier by forming release features pattern-wise on said surface of the carrier, where the release features are configured to reduce adhesion in the areas between said surface of the carrier and the flexible substrate that contact the release features, and where each of the release features are formed within one of the corresponding unit areas enclosed by the retaining features.

11. The method of claim 1 wherein the flexible substrate is plastic.

12. The method of claim 1, wherein at least one retaining feature comprises a lip formed on a backside of the carrier opposite said surface of the carrier for retaining the flexible substrate on the carrier.

13. The method of claim 12 wherein the carrier is glass.

14. The method of claim 1, wherein at least one retaining feature comprises at least one groove formed in the carrier.

15. The method of claim 1 wherein the flexible substrate is selected from the group including metals and plastics.

16. A method for forming thin film electronic devices on a flexible substrate, the method comprising:
conditioning a surface of a carrier to form a regular pattern of release feature sections on said surface of the carrier for reducing adhesion of the carrier to the flexible substrate in the areas of said surface of the carrier that contact the release feature sections;

forming the flexible substrate by deposition of one or more layers of flexible substrate material onto the carrier and the release feature sections;

processing portions of the deposited flexible substrate that are over the release feature sections to form a thin film electronic device in each portion using deposition, patterning and etching; and releasing at least the processed portions of the flexible substrate that are over the release feature sections from the carrier to provide a plurality of flexible substrates each having the thin film electronic device formed thereon.

17. A method for forming electronic devices on a flexible substrate, the method comprising:

conditioning a surface of a carrier to form a plurality of retaining sections thereon, where the retaining sections are arranged as a matrix of rows and columns on said surface of the carrier for retaining the flexible substrate thereon, and where each of the of retaining sections comprises a corresponding unit area on said surface of the carrier;

conditioning a portion of said surface of the carrier to form a plurality of release sections thereon, where the release sections reduce adhesion in those areas between said surface of the carrier and the flexible substrate that contact the release sections, and where each of the release sections is formed within one of the corresponding unit areas of the retaining sections;

applying the flexible substrate by deposition of one or more layers of flexible substrate material onto the surface of the carrier, the retaining sections, and onto the release sections;

processing portions of the flexible substrate over the release sections using deposition, patterning and etching to form the electronic devices thereon; and releasing the portions of the flexible substrate over the release sections from the carrier to provide the flexible substrate having electronic devices formed thereon.

18. The method of claim 17 wherein the releasing comprises cutting the portion of the substrate with release features from a portion without release features.

19. The method of claim 9, wherein the flexible substrate includes a uniform thickness over the matrix of retaining features.

20. The method of claim 19, wherein each electronic device is formed within an inner boundary of the corresponding unit area on said surface of the carrier.

21. The method of claim 20, wherein the step of releasing comprises releasing and removing a plurality of electronic devices from the carrier by cutting through the flexible substrate within each said inner boundary to separate from the carrier a portion of the flexible substrate having one electronic device formed thereon.

22. The method of claim 21, wherein the electronic device comprises a thin-film transistor device.

* * * * *